United States Patent [19]
Tatsumi

[11] Patent Number: 6,060,391
[45] Date of Patent: May 9, 2000

[54] VAPOR PHASE GROWTH METHOD

[75] Inventor: Toru Tatsumi, Tokyo, Japan

[73] Assignee: NEC Corporation, Tokyo, Japan

[21] Appl. No.: 08/844,634

[22] Filed: Apr. 21, 1997

[30] Foreign Application Priority Data

Apr. 22, 1996 [JP] Japan .................................. 8-100270

[51] Int. Cl.[7] .................................................. H01L 21/44
[52] U.S. Cl. .......................... 438/680; 438/681; 438/683; 438/685
[58] Field of Search .................................... 438/626, 641, 438/643, 644, 645, 680, 681, 683, 685

[56] References Cited

U.S. PATENT DOCUMENTS

| 5,202,283 | 4/1993 | Younger et al. | 438/925 |
| 5,691,009 | 11/1997 | Sandhu | 427/534 |
| 5,840,628 | 11/1998 | Miyamoto | 438/680 |

FOREIGN PATENT DOCUMENTS 408753   9/1989   European Pat. Off. .

*Primary Examiner*—David Nelms
*Assistant Examiner*—Reneé R. Berry
*Attorney, Agent, or Firm*—Sughrue, Mion, Zinn, Macpeak & Seas, PLLC

[57] ABSTRACT

A heating mechanism for heating a substrate is disposed in a growth chamber, a bulb capable of controlling the quantity of gas flowing into the growth chamber is provided between a plurality of organic metal gas sources and the growth chamber. A plasma chamber for inert gas having a transparent portion is provided, the plasm chamber receiving a part of an organic metal raw material gas supplied to the growth chamber through an orifice. The plasma chamber is provided with an exhaustion system performing a differential air exhausting for the plasma chamber and the growth chamber. Provided is an optical system for measuring an light emission intensity by separating emitted light characteristic of a metal in the organic metal raw material gas, the light is emitted from the metal by exciting the organic metal raw material gas partially supplied to the plasma chamber from the growth chamber through the orifice.

10 Claims, 3 Drawing Sheets

VAPOR PHASE GROWTH METHOD

BACKGROUND OF THE INVENTION

The present invention relates to a method and an apparatus of chemical vapor deposition using an organic metal material and, more particularly, to such method and apparatus for growing a high dielectric substance film and/or a ferroelectric film used for a capacitor, an insulated gate transistor and the like.

As micronization and integration density of a semiconductor device have been increased, such ceramic materials have been required as possessing a high dielectric constant and a ferroelectric constant for a capacitor and/or an insulated gate transistor. In applying such ceramic materials to the semiconductor device it is extremely important to deposit the ceramic materials as thin as possible on a semiconductor substrate.

For a deposition method of the thin film, many methods such as a sol-gel method and a sputtering method have been proposed. However, a chemical vapor deposition method is expected to be excellent and promising in uniformity for a large diameter wafer and in a coverage for a step difference.

Metals which are constituent elements of the ceramic material possessing a high dielectric constant and a ferroelectric constant are Ba, Sr, Bi, Pb, Ti, Zr, Ta, La and the like because of hardly obtaining proper hydride and chloride. For this reason, a chemical vapor deposition method employing organic metals, i.e. MOCVD method, is used. However, these organic metals exhibit a low vapor pressure, and many of them are in solid or liquid state under a condition of a room temperature. To transport the organic metals of low vapor pressure, raw materials of them and pipes for their passage are heated. For this reason, a mass flow controller can not be used for these organic metals so that it is difficult to precisely control the flow rate.

For a organic metal vapor phase growth method, a transportation method using carrier gas has been used. FIG. 2 shows a conventional reaction gas supply method where a carrier gas is used. In FIG. 2, reference numeral 201 denotes a constant temperature chamber; 202, a bottle; and 203, an organic metal raw material prepared in the bottle 202, which is, for example, strontium-bis-di-piballoymetanat Sr $(DPM)_2$ and Barium-bis-di-piballoymetanat Ba $(DPM)_2$ and is kept at a solid state at a normal temperature. Reference numeral 204 denotes a supply pipe of inert carrier gas such as Ar and $N_2$, and reference numeral 205 denotes a supply pipe of the organic metal raw material gas transported by the carrier gas from the pipe 204. This raw material gas is supplied to a growth chamber 207 including a heating mechanism 206 on which a semiconductor wafer 208 is disposed. The exhaustion of gases is performed through a port 209. The reference numeral 210 indicates a mass flow controller for the carrier gas.

In this apparatus, in the case where the organic metal gas kept at a solid state at a normal temperature is used as described above, in order to produce sufficient vapor pressure, the bottle and the supply pipe must be heated to a high temperature unlike the case where a raw material keeping a gaseous state at a normal temperature is used. Since a flow meter capable of being used at a high temperature has not been developed yet, it is difficult to quantify the flow rate of the organic metal gas in the carrier gas and to accurately control the flow rate. Specifically, an organic metal compound such as DPM exhibiting a vapor pressure more than a saturation vapor pressure, which is determined by a temperature at the constant temperature chamber 201, is contained in the carrier gas. The flow rate of the organic metal raw material gas is determined depending on a surface area of a solid of the organic metal compound raw material and a temperature of the constant temperature chamber as well as the flow rate of the carrier gas and the like. However, it becomes difficult to accurately control the flow rate because of many parameters as described above.

For these reasons, the flow rate of the organic metal raw material has been reversely calculated by analyzing the grown thin film, in order to establish appropriate process conditions. Many parameters involve the change with the passage of time so that it has been difficult to form the film with a high reproducibility.

SUMMARY OF THE INVENTION

It is therefore an object of the present invention is to provide a CVD method and apparatus using an organic metal raw material exhibiting a low vapor pressure, which is capable of simultaneously supplying a plurality of organic metal raw materials with good reproducibility and stability.

A chemical vapor deposition method using an organic metal raw material is characterized in accordance with the present invention in that organic metal raw material gas is supplied to a vapor phase growth chamber to form a metal compound film on a substrate in a vapor phase, the organic metal raw material supplied to the growth chamber is partially made to flow into plasma contained in inert gas in a plasma chamber through the growth chamber and an orifice, the plasma chamber being subjected to a differential air exhaustion. The organic metal gas is excited in plasma to emit light, and a light emission intensity of light characteristic of the metal in the organic metal gas is measured. The partial pressure of the organic metal gas in the growth chamber is monitored depending on the light emission intensity, and the quantity of the organic metal raw material gas to be supplied to the growth chamber is controlled by the partial pressure of the organic metal gas.

Furthermore, the chemical vapor deposition apparatus according to the present invention using organic metal raw material comprises a vapor phase growth chamber having means for heating a substrate; an organic metal raw material gas supplying section which is capable of variably controlling the flow rate of the organic metal raw material gas supplied into the growth chamber; a plasma chamber, from which air is exhausted therefrom through the growth chamber and an orifice with an exhaustion speed different from that for the growth chamber and in which inert gas plasma is generated, the plasma chamber having a transparent portion; control means having an optical system to measure light emission intensity through the transparent portion of the plasma chamber, the control means controlling the quantity of the flow rate of the organic metal raw material gas to be supplied to the growth chamber, depending on the light emission intensity.

The orifice serves to produce a conductance between the vapor phase growth chamber and the plasma chamber, the plasma chamber having differential air exhaustion means in order for the plasma chamber to be capable of exhausting the air independently of the vapor phase growth chamber.

If a plurality of the organic metal raw materials are used in the vapor phase growth apparatus of the present invention, a raw material supply section may be provided for each raw material. In the optical system, there may be provided a prism and a band filter which separate the emitted light of the organic metal raw material gas against each metal. At the same time, there may be provided a function which controls the flow rate of each organic metal raw material gas to be supplied to the growth chamber corresponding to the light emission intensity of each metal.

In operation, organic metal gas is dissolved in plasma. Further, the dissolved metal is excited and light emission phenomenon characteristic of the metal takes place. Since an ionization potential of the metal is comparatively low, approximately 100% of the metal is ionized in plasma. Therefore, the light emission intensity characteristic of the metal is in proportion to the flow rate of the organic metal gas supplied into the plasma chamber. Specifically, the light emission intensity thereof is in proportion to the partial pressure of the organic metal gas in the plasma chamber. The partial pressure of the organic metal gas in the plasma chamber is determined depending on the conductance produced by the orifice and an air exhaustion speed of the plasma chamber. The partial pressure of the organic metal gas in the plasma chamber is in proportion to the partial pressure of the organic metal gas in the growth chamber. Therefore, the flow rate of the organic metal gas to be supplied to the growth chamber can be measured by monitoring the light emission intensity of the metal.

According to the present invention, the partial pressure of the organic metal gas in the growth chamber is monitored depending on the light emission intensity characteristic of the metal, and the flow rate of the organic en metal raw material gas to be supplied to the growth chamber is controlled based on the partial pressure of the organic metal gas, whereby the quantity of the supply of the organic metal raw material for which it has been impossible to control the flow rate because of its low vapor pressure will be controlled accurately.

Furthermore, since electron temperature of plasma is different depending on a plasma generating source used, with an employment of an inductively coupled high frequency plasma source as the plasma source, plasma can be generated having the temperature to selectively ionize metals exhibiting a lower ionization potential than that of carbon and oxygen among a metal, carbon and oxgen generated when the organic metal dissolves in plasma. Therefore, more accurate control for the supply quantity of the organic metal raw material can be conducted without being influenced by a light emission by carbon and oxygen.

BRIEF DESCRIPTION OF THE DRAWINGS

For more complete understanding of the present invention and the advantages thereof, reference is now made to the following description taken in conjunction with the accompanying drawings, in which:

In FIG. 1 and FIG. 2, the identifying numerals have the following meaning.

FIG. 1: 101 a growth chamber; 102 an orifice; 103 a plasma chamber, 104 an optical fiber; 105 a photo multiplier; 106 a filter; 107 a prism; 108 a control electrode; 109 a control line; 110 a turbo pump; 111 an inert gas source; 112 a semiconductor wafer; 113 a heating mechanism; 114 a valve; 115 an MO gas supply source; 116 a turbo pump.

FIG. 2: 201 a constant temperature chamber; 202 a bottle; 203 an organic metal raw material; 204 a supply pipe for inert carrier gas; 205 a supply pipe for inorganic metal raw meterial gas; 206 a heating mechanism; 207 a growth chamber; 208 a semiconductor wafer; 209 a port; 210 a mass flow controller; and 116 a turbo pump.

DETAILED DESCRIPTION OF THE PREFERRED EMBODIMENTS

Figure 1:
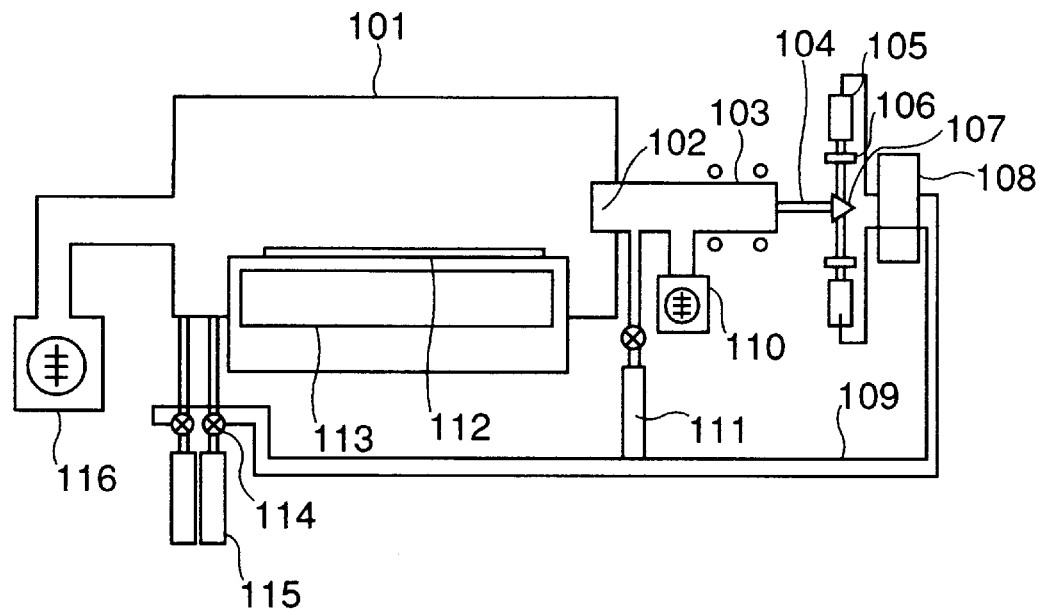
FIG. 1 is a schematic view showing a CVD apparatus according to an embodiment of the present invention.

Referring now to FIG. 1, a CVD apparatus according to an embodiment of the present invention employs a plasma source using an inert gas. Particularly, an orifice 102 having a certain amount of a conductance between a growth chamber 101 and a plasma chamber 103 is provided therebetween. In the plasma source, an air exhaustion system for a differential air exhaustion is arranged, which performs the differential air exhaustion for the plasma chamber and the growth chamber. Furthermore, provided are an optical fiber 104 to draw out plasma light, a prism 107 to divide the drawn out light, a band-pass filter 106 to pass only the light having a wavelength characteristic of the metal therethrough, a photo multiplier 105 to measure the light intensity passing through the filter 106, a control electrode 108 to control a variable flow valve by an electric signal converted by the photo multiplier 105, and the variable conductance bulb to connect a bomb containing the organic metal (hereinafter, referred to as M0) raw material and the growth chamber and to control the inflow of the M0 raw material into the growth chamber.

A part of the M0 gas introduced into the growth chamber flows into the plasma chamber from the growth chamber. Partial pressure of the M0 gas in the plasma chamber is determined by the conductance of the shielding plate (orifice) 102 and an air exhaustion speed of the plasma chamber by a turbo pump 110. Partial pressure of the M0 gas in the plasma chamber is in proportion to the partial pressure of the M0 gas in the growth chamber. The M0 gas flowing into plasma is dissolved and the dissolved metal is excited, whereby light emission characteristic of the metal takes place. Ionization potential of the metal is low, whereby approximately 100% of the metal is ionized in the plasma and the light emission intensity thereof is in proportion to the flow rate of the M0 gas into the growth chamber, namely, the partial pressure of the M0 gas in the growth chamber. Therefore, by monitoring the light emission intensity and controlling the valve 114 provided between the M0 gas supply source and the growth chamber, the partial pressure of the M0 gas in the growth chamber, namely, the quantity of the M0 gas flowing into the growth chamber, can be controlled.

EXAMPLE

The growth of lead titanate $PbTiO_3$ by introducing tetra iso-propoxy titanium Ti $(i\text{-}OC_8H_7)$, lead bis-di-iballoymetanate Pb $(DPM)_2$ and oxygen into the growth chamber will be described.

A $SiO_2$ film of 100 nm thick is formed on a substrate by oxidizing Si. A Pt film of 100 nm thick is deposited thereon using a sputtering method. The resultant structure is used for the growth of the lead titanate PbTiO$_3$ film. A temperature of the substrate is set to be 550° C. High density plasma using ECR (electron cyclotron resonance) is employed as a plasma source. Ar is introduced into the plasma chamber and plasma is generated keeping the Ar partial pressure at 3×10$^{-4}$ Torr. The orifice 102 of diameter 1 mm is provided between the plasma chamber and the growth chamber to produce conductance therebetween.

The light tube (optical fiber) 104 is provided in the plasma source, and plasma emission light is partially drawn out. The drawn out plasma emission light is divided into two lights derived from Ti and Pb by the prism 107. The light derived from Ti is passed through the band pass filter passing light having a wavelength of 334.9 nm. The light derived from Pb is passed through the band pass filter passing through light having a wavelength of 220.4 nm. Then, both of them are introduced to a photo multiplier 105, where the light emission intensity of them is measured.

The Pb (DPM)$_2$ supply source is heated to 160° C. and the growth chamber 101 and the Pb raw material supply pipe are heated to 220° C., in order for the Pb raw material not to be attached to them. The Ti (i-OC$_3$H$_7$)$_4$ supply source is set to be a temperature of 120° C. In order to confirm the supply quantity of the Ti raw material, a high temperature mass flow controller is inserted to the Ti (i-OC$_3$H$_7$)$_4$ supply pipe and the Ti (i-OC$_3$H$_7$)$_4$ is set to be 160° C. that is an upper limit of tolerable temperature. The Ti raw material exhibits a high vapor pressure among the organic metal gases and can be controlled by the mass flow controller.

Figure 3:
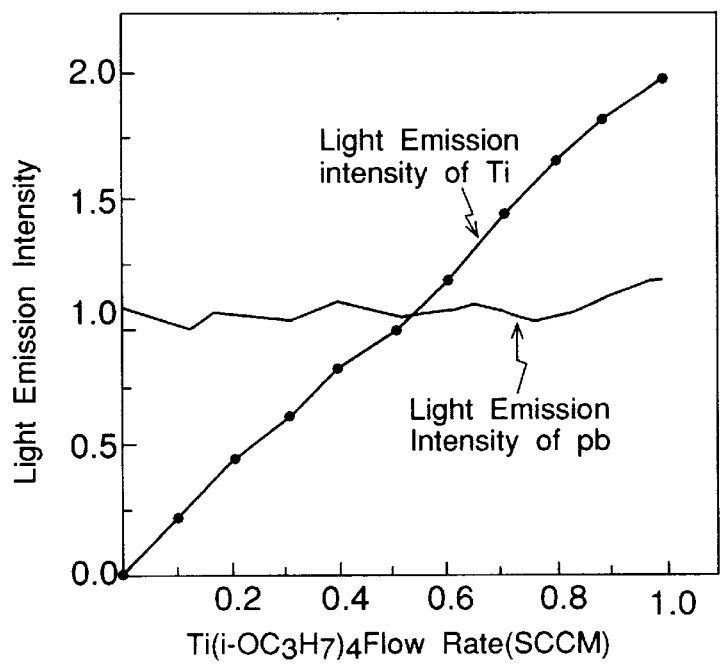
FIG. 3 is a graph showing a relation between a supply quantity and a light emission intensity of Ti and Pb when a raw material of Ti is supplied controlling the flow rate of the raw material of Ti with a Ti mass flow controller.

FIG. 3 is a graph showing a relation between the supply quantity of the Ti raw material and the light emission intensities of Ti and Pb, when the flow rate of the Ti raw material is controlled by the Ti mass flow controller. As is understood from FIG. 3, the supply quantity of the Ti raw material is in proportion to the Ti light emission intensity and the Pb light emission intensity makes no variation depending on a background.

Figure 4:
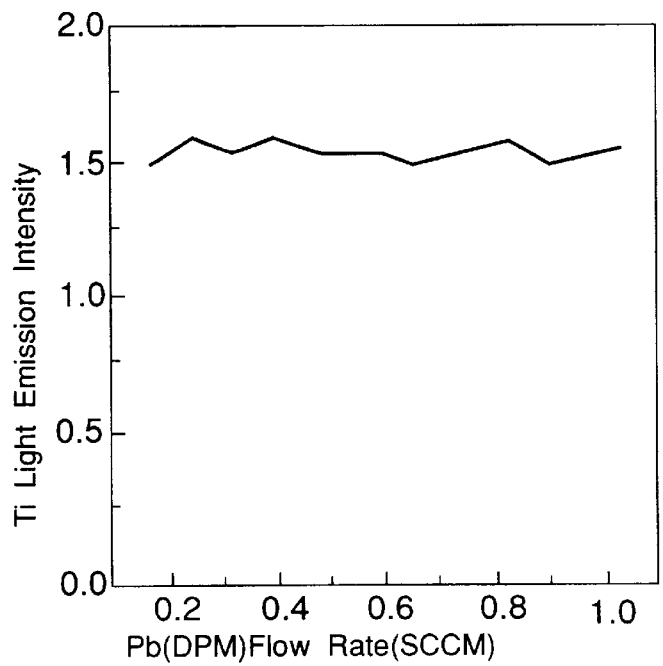
FIG. 4 is a graph showing a variation in the light emission intensity of Ti when the light emission intensity of Pb is varied by adjusting an opening of a bulb for supplying a Pb raw material, keeping a flow rate of the Ti raw material.

FIG. 4 is a graph showing the result of the investigation for the variations in the Ti light emission intensity when the Pb light intensity is varied, keeping the flow rate of the Ti raw material constant and adjusting the opening of the bulb for the Pb raw material supply. As is understood from FIG. 4, the Ti light emission intensity makes no variation even when the Pb flow rate is varied. From the above results, the light emission intensities of the metals are in proportion to the quantity of the organic metal gas to be supplied to the growth chamber. It is found that both of the Ti light emission intensity and the Pb light emission intensity do not interfere with each, when the light emission intensities are measured with two kinds of wavelengths.

Figure 2:
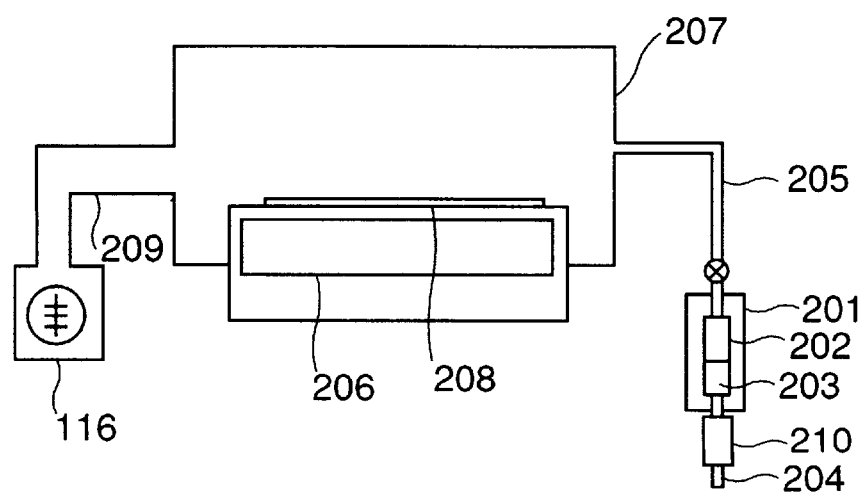
FIG. 2 is a schematic view showing a conventional prior art thin film vapor phase growth apparatus according to a reaction gas supply method using carrier gas.
Figure 5:
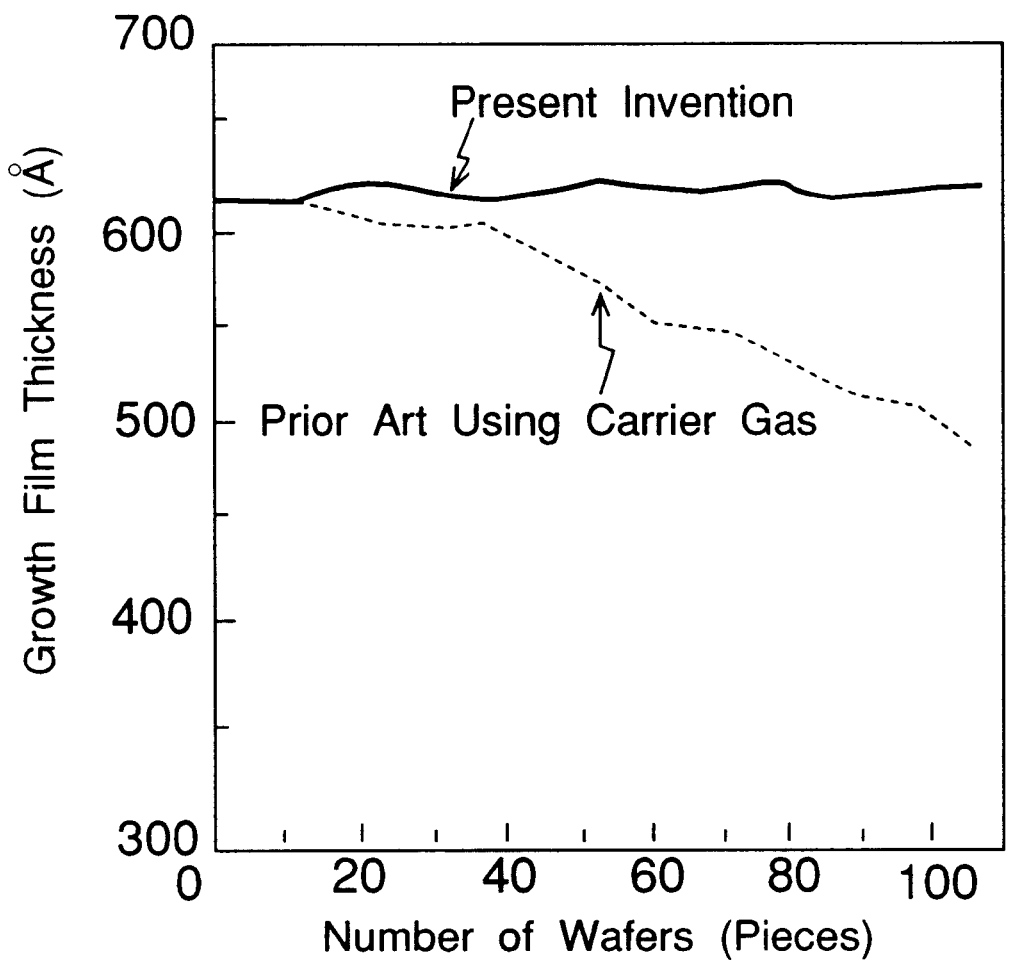
FIG. 5 is a graph showing a relation between the number of grown films and a thickness of the grown film, using Pb and Ti composition ratios as parameters.

FIG. 5 is a graph showing a relation between the number of the PbTiO$_3$ films and the Pb and Ti compound ratio when the PbTiO$_3$ films are formed on Pt. The conductance variable valve of each gas is controlled and the growth time is set to be constant, that is, 13 minutes, such that the light emission intensity of each wavelength of Pb and Ti. For comparison, the relation between the number of the films, and the thickness of the grown film and the composition ratio when the films are grown by the method using the carrier gas shown in FIG. 2. Controlling of the quantity of the supply of the raw material is conducted under the 1condition that the quantity of the carrier gas, the temperature of the gas source and the growth time are constant.

As is understood from FIG. 5, in the conventional method using the carrier gas, when the 50 films are grown, the growth speed gradually reduces and the composition ratio of Pb reduces. The reason for this is regarded as that the surface area of the solid raw material reduces because of the consumption of the organic metal source of Pb and the partial pressure of the Pb (DPM)$_2$ in the carrier gas is lowered.

On the contrary, because in the method of the present invention, the quantity of the supply of the organic metal raw material can be controlled without the reduction in the surface area of the solid raw material, it is found that there is no variation in the thickness of the grown film in spite of the fact that the number of the films varies and the reproducibility of the film growth is very excellent. In this embodiment, the description was made for the example of the formation of the PbTiO$_3$ film using Pb (DPM)$_2$ and Ti (i-OC$_3$H$_7$)$_4$. In the case where a BaSrTiO$_3$ film is formed using Ba (DPM)$_2$, Sr (DPM)$_2$ and Ti (i-OC$_3$H$_7$), and also in the case where a PbZrTiO$_3$ film is formed using Pb (DPM)$_2$, Zr (DPM)$_2$ and Ti (i-OC$_3$H$_7$)$_4$, namely, in the case where these films are formed using other organic metal raw materials, it was confirmed that the reproducibility and controllability are increased.

As described above, in the vapor phase growth apparatus using the organic metal of the present invention, the plasma chamber for inert gas subjected to the differential air exhaustion through the orifice is provided, the partial pressure of the organic metal gas in the growth chamber is monitored depending on the light emission intensity characteristic of the metal in the organic metal gas, which is excited with plasma. Thus, the opening of the valve arranged between the organic metal gas chamber and the growth chamber is controlled, whereby the vapor phase growth of the ceramic using the organic metal can be realized, which is capable of simultaneously supplying a plurality of the organic metal raw materials with high reproducibility and stability.

Furthermore, for the organic metal raw materials of a low vapor pressure, the flow rate of which was uncontrollable with the mass flow controller, their supply quantity can be precisely controlled without reduction in the surface area of the organic metal raw material.

Furthermore, according to the present invention, the quantity of the organic metal raw material can be controlled in the growth chamber at the time of formation of the film.

Although the preferred embodiment of the present invention has been described in detail, it should be understood that various changes, substitutions and alternations can be made therein without departing from spirit and scope of the inventions as defined by the appended claims.

What is claimed is:

1. A chemical vapor deposition method comprising
   supplying organic metal raw material gas to a vapor phase growth chamber to form an organic metal film on a substrate in a vapor phase;
   mixing a part of said organic metal raw material gas supplied to said growth chamber with inert gas in a plasma chamber which is connected to said growth chamber;
   monitoring a partial pressure of said organic metal raw material gas in said growth chamber depending on an emission intensity of light characteristic of a metal in said organic metal raw material gas, said light being emitted from said organic metal raw material gas being excited with a plasma of said inert gas in said plasma chamber; and
   controlling the quantity of said organic metal raw material gas to be supplied to said growth chamber depending on said partial pressure of said organic metal raw material gas in said growth chamber.

2. The chemical vapor deposition method as claimed in claim 1, wherein
said plasma of said inert gas in said plasma chamber is generated by employing an ECR as a plasma generating source.

3. The chemical vapor deposition method as claimed in claim 1, wherein
said plasma of said inert gas in said plasma chamber is generated by employing an inductively coupled high frequency plasma source as a plasma generating source.

4. The chemical vapor deposition method as claimed in claim 1, wherein
said plasma of said inert gas in said plasma chamber has a temperature to selectively ionize said metal in said organic metal raw material gas.

5. The chemical vapor deposition method as claimed in claim 1, wherein
said partial pressure of said organic metal gas in said growth chamber is determined by said partial pressure of said organic metal gas in said plasma chamber that is dependent on said emission intensity.

6. The chemical vapor deposition method as claimed in claim 1, wherein
said plasma chamber is connected to said growth chamber through an orifice, said plasma chamber is subjected to an air exhaustion, and an air exhaustion speed for said plasma chamber is different from an air exhaustion speed for said growth chamber.

7. A chemical vapor deposition method comprising:

supplying an organic metal raw material gas comprising a plurality of organic metal raw materials to a vapor phase growth chamber to form an organic metal film on a substrate in a vapor phase;

mixing a part of said plurality of organic metal raw materials supplied to said growth chamber with inert gas in a plasma chamber which is connected to said growth chamber;

monitoring a partial pressure of each of said plurality of organic metal raw materials in said growth chamber depending on each emission intensity of light characteristic of each metal in said plurality of organic metal raw materials, respectively, said light being emitted from said plurality of organic metal raw materials being excited with a plasma of said inert gas in said plasma chamber; and controlling each quantity of said plurality of organic metal raw materials supplied to said growth chamber dependent on each of said partial pressure of said plurality of organic metal raw materials in said growth chamber, respectively.

8. The chemical vapor deposition method as claimed in claim 1, wherein
said organic metal raw material gas comprises at least one of Pb, Ti, Ba, Sr, Bi, Zr, Ta or La as a constituent element.

9. The chemical vapor deposition method as claimed in claim 7, wherein
each of said plurality of organic metal raw materials comprises at least one of Pb, Ti, Ba, Sr, Bi, Zr, Ta or La as a constituent element.

10. The chemical vapor deposition method as claimed in claim 1, wherein
said organic metal raw gas is supplied to said growth chamber without a carrier gas.

* * * * *